US009985152B2

(12) United States Patent
Jones-Albertus et al.

(10) Patent No.: US 9,985,152 B2
(45) Date of Patent: *May 29, 2018

(54) LATTICE MATCHABLE ALLOY FOR SOLAR CELLS (71) Applicant: SOLAR JUNCTION CORPORATION, San Jose, CA (US)

(72) Inventors: Rebecca Elizabeth Jones-Albertus, Washington, DC (US); Homan Bernard Yuen, Santa Clara, CA (US); Ting Liu, San Jose, CA (US); Pranob Misra, Santa Clara, CA (US)

(73) Assignee: SOLAR JUNCTION CORPORATION, San Jose, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/391,659

(22) Filed: Dec. 27, 2016

(65) Prior Publication Data
US 2017/0110607 A1    Apr. 20, 2017

Related U.S. Application Data (60) Continuation of application No. 14/979,899, filed on Dec. 28, 2015, now abandoned, which is a (Continued)

(51) Int. Cl.
*H01L 31/00* (2006.01)
*H01L 31/0304* (2006.01)
(Continued)

(52) U.S. Cl.
CPC ...... *H01L 31/03048* (2013.01); *C30B 23/025* (2013.01); *C30B 23/066* (2013.01);
(Continued)

(58) Field of Classification Search
CPC ........ H01L 31/03046; H01L 31/03048; H01L 31/0725; H01L 31/0735
(Continued)

(56) References Cited

U.S. PATENT DOCUMENTS

| 4,179,702 A | 12/1979 | Lamorte |
| 4,404,421 A | 9/1983 | Fraas |

(Continued)

FOREIGN PATENT DOCUMENTS

| CN | 1917241 A | 2/2007 |
| EP | 595634 | 5/1994 |

(Continued)

OTHER PUBLICATIONS

Search Report for Taiwan Application No. 101116335, dated Dec. 5, 2016, 1 page.
(Continued)

*Primary Examiner* — Matthew T Martin
*Assistant Examiner* — Dujuan A Horton (57) ABSTRACT

An alloy composition for a subcell of a solar cell is provided that has a bandgap of at least 0.9 eV, namely, $Ga_{1-x}In_xN_yAs_{1-y-z}Sb_z$ with a low antimony (Sb) content and with enhanced indium (In) content and enhanced nitrogen (N) content, achieving substantial lattice matching to GaAs and Ge substrates and providing both high short circuit currents and high open circuit voltages in GaInNAsSb subcells for multijunction solar cells. The composition ranges for $Ga_{1-x}In_xN_yAs_{1-y-z}Sb_z$ are $0.07 \leq x \leq 0.18$, $0.025 \leq y \leq 0.04$ and $0.001 \leq z \leq 0.03$.

18 Claims, 5 Drawing Sheets

Related U.S. Application Data continuation of application No. 14/678,737, filed on Apr. 3, 2015, now Pat. No. 9,252,315, which is a continuation of application No. 14/597,621, filed on Jan. 15, 2015, now abandoned, which is a continuation of application No. 14/512,224, filed on Oct. 10, 2014, now Pat. No. 9,018,522, which is a continuation of application No. 13/739,989, filed on Jan. 11, 2013, now Pat. No. 8,912,433, which is a division of application No. 12/749,076, filed on Mar. 29, 2010, now abandoned.

(51) Int. Cl.
| | | |
|---|---|---|
| *H01L 31/0725* | (2012.01) | |
| *H01L 31/0735* | (2012.01) | |
| *C30B 29/40* | (2006.01) | |
| *C30B 23/06* | (2006.01) | |
| *C30B 23/02* | (2006.01) | |
| *C30B 33/02* | (2006.01) | |
| *H01L 31/18* | (2006.01) | |

(52) U.S. Cl.
CPC ............. *C30B 29/40* (2013.01); *C30B 33/02* (2013.01); *H01L 31/0725* (2013.01); *H01L 31/0735* (2013.01); *H01L 31/1844* (2013.01); *H01L 31/1852* (2013.01)

(58) Field of Classification Search
USPC ........................................ 136/255, 262, 252
See application file for complete search history.

(56) References Cited

U.S. PATENT DOCUMENTS

| | | | |
|---|---|---|---|
| 4,881,979 A | 11/1989 | Lewis | |
| 4,935,384 A | 6/1990 | Wanlass | |
| 5,009,719 A | 4/1991 | Yoshida | |
| 5,016,562 A | 5/1991 | Madan et al. | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A | 9/1998 | Vilela et al. | |
| 5,911,839 A | 6/1999 | Tsai et al. | |
| 5,935,345 A | 8/1999 | Kuznicki | |
| 5,944,913 A | 8/1999 | Hou et al. | |
| 6,150,603 A | 11/2000 | Karam et al. | |
| 6,252,287 B1 | 6/2001 | Kurtz et al. | |
| 6,281,426 B1 | 8/2001 | Olson et al. | |
| 6,340,788 B1 | 1/2002 | King et al. | |
| 6,504,091 B2 | 1/2003 | Hisamatsu et al. | |
| 6,617,618 B2 | 9/2003 | Sato | |
| 6,660,928 B1 | 12/2003 | Patton et al. | |
| 6,756,325 B2 | 6/2004 | Bour et al. | |
| 6,764,926 B2 | 7/2004 | Takeuchi et al. | |
| 6,765,238 B2 | 7/2004 | Chang et al. | |
| 6,787,385 B2 | 9/2004 | Barber et al. | |
| 6,815,736 B2 | 11/2004 | Mascarenhas | |
| 6,951,819 B2 | 10/2005 | Iles et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,123,638 B2 | 10/2006 | Leary et al. | |
| 7,126,052 B2 | 10/2006 | Fetzer et al. | |
| 7,255,746 B2 | 8/2007 | Johnson et al. | |
| 7,279,732 B2 | 10/2007 | Meng et al. | |
| 7,709,287 B2 | 5/2010 | Fatemi et al. | |
| 7,727,795 B2 | 6/2010 | Stan et al. | |
| 7,807,921 B2 | 10/2010 | Fetzer et al. | |
| 7,842,881 B2 | 11/2010 | Corrifeld et al. | |
| 8,067,687 B2 | 11/2011 | Wanlass | |
| 8,575,473 B2 | 11/2013 | Jones et al. | |
| 9,018,522 B2 * | 4/2015 | Jones-Albertus | C22C 28/00 136/262 |
| 9,153,724 B2 | 10/2015 | Jones-Albertus et al. | |
| 2002/0000546 A1 | 1/2002 | Sato | |
| 2002/0117675 A1 | 8/2002 | Mascarenhas | |
| 2002/0195137 A1 | 12/2002 | King et al. | |
| 2003/0070707 A1 | 4/2003 | King et al. | |
| 2003/0145884 A1 | 8/2003 | King et al. | |
| 2004/0045598 A1 | 3/2004 | Narayanan et al. | |
| 2004/0079408 A1 | 4/2004 | Fetzer et al. | |
| 2004/0130002 A1 | 7/2004 | Weeks et al. | |
| 2004/0187912 A1 | 9/2004 | Takamoto et al. | |
| 2004/0200523 A1 | 10/2004 | King et al. | |
| 2005/0139863 A1 | 6/2005 | Welser et al. | |
| 2005/0155641 A1 | 7/2005 | Fafard | |
| 2005/0274409 A1 | 12/2005 | Fetzer et al. | |
| 2006/0144435 A1 | 7/2006 | Wanlass | |
| 2006/0162768 A1 | 7/2006 | Wanlass et al. | |
| 2007/0034853 A1 | 2/2007 | Robbins et al. | |
| 2007/0131275 A1 | 6/2007 | Kinsey et al. | |
| 2007/0227588 A1 | 10/2007 | Gossard et al. | |
| 2008/0035939 A1 | 2/2008 | Puetz et al. | |
| 2008/0149173 A1 | 6/2008 | Sharps | |
| 2008/0245400 A1 | 10/2008 | Li | |
| 2008/0257405 A1 | 10/2008 | Sharps | |
| 2009/0001412 A1 | 1/2009 | Nagai et al. | |
| 2009/0014061 A1 | 1/2009 | Harris et al. | |
| 2009/0057721 A1 | 3/2009 | Miura et al. | |
| 2009/0078310 A1 | 3/2009 | Stan et al. | |
| 2009/0145476 A1 | 6/2009 | Fetzer et al. | |
| 2009/0155952 A1 | 6/2009 | Stan et al. | |
| 2009/0229659 A1 | 9/2009 | Wanlass et al. | |
| 2009/0255575 A1 | 10/2009 | Tischler | |
| 2009/0255576 A1 | 10/2009 | Tischler | |
| 2009/0272438 A1 | 11/2009 | Cornfeld | |
| 2009/0288703 A1 | 11/2009 | Stan et al. | |
| 2010/0087028 A1 | 4/2010 | Porthouse et al. | |
| 2010/0096001 A1 | 4/2010 | Sivananthan et al. | |
| 2010/0180936 A1 | 7/2010 | Kim | |
| 2010/0218819 A1 | 9/2010 | Farmer et al. | |
| 2010/0282305 A1 | 11/2010 | Sharps et al. | |
| 2010/0282306 A1 | 11/2010 | Sharps et al. | |
| 2010/0319764 A1 | 12/2010 | Wiemer et al. | |
| 2011/0023958 A1 | 2/2011 | Masson et al. | |
| 2011/0114163 A1 | 5/2011 | Wiemer et al. | |
| 2011/0210313 A1 | 9/2011 | Fujii et al. | |
| 2011/0232730 A1 | 9/2011 | Jones et al. | |
| 2011/0303268 A1 | 12/2011 | tan et al. | |
| 2012/0031478 A1 | 2/2012 | Boisvert et al. | |
| 2012/0103403 A1 | 5/2012 | Misra et al. | |
| 2012/0211071 A1 | 8/2012 | Newman et al. | |
| 2012/0216858 A1 | 8/2012 | Jones-Albertus et al. | |
| 2012/0216862 A1 | 8/2012 | Abou-Kandil et al. | |
| 2012/0227797 A1 | 9/2012 | Stan et al. | |
| 2012/0285526 A1 | 11/2012 | Jones-Albertus et al. | |
| 2013/0014815 A1 | 1/2013 | Jones-Albertus et al. | |
| 2013/0118546 A1 | 5/2013 | Jones-Albertus et al. | |
| 2013/0118566 A1 | 5/2013 | Jones-Albertus et al. | |
| 2013/0122638 A1 | 5/2013 | Jones-Albertus et al. | |
| 2013/0220409 A1 | 8/2013 | Jones-Albertus et al. | |
| 2015/0214412 A1 | 7/2015 | Jones-Albertus et al. | |
| 2016/0118526 A1 | 4/2016 | Misra et al. | |
| 2017/0338357 A1 | 11/2017 | Liu et al. | |

FOREIGN PATENT DOCUMENTS

| | | |
|---|---|---|
| EP | 3159935 A | 4/2017 |
| JP | 63100781 A | 5/1988 |
| JP | 6061513 A | 3/1994 |
| JP | 6061516 A | 3/1994 |
| JP | 10012905 A | 1/1998 |
| JP | 2006-270060 A | 10/2006 |
| JP | 2008-270760 A | 11/2008 |
| TW | 200924214 A | 6/2009 |
| TW | 200933913 A | 8/2009 |
| TW | 201131788 A | 9/2011 |

(56) References Cited

FOREIGN PATENT DOCUMENTS

| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |

OTHER PUBLICATIONS

Aho et al., "Temperature Coefficients for GaInP/GaAs/GaInNAsSb Solar Cells," 11th International Conference on Concentrator Photovoltaic Systems, AIP Conference Proceedings, Sep. 2015, vol. 1679, p. 050001-1-5.

Miyashita et al., "Generation and Collection of Photocarriers in Dilute Nitride GaInNAsSb Solar Cells," Progress in Photovoltaics: Research and Applications, 2016, vol. 24, p. 28-37.

Miyashita et al., "Characterization of 1.0 EV GaInNAsSb Solar Cells for Multifunction Applications and the Effect of Annealing," 31st European Photovoltaic Solar Energy Conference and Exhibition, Sep. 2015, p. 1461-1465.

Sabnis et al., "High-Efficiency Multijunction Solar Cells Employing Dilute Nitrides," 8th International Conference on Concentrating Photovoltaic Systems, AIP Conference Proceedings, Oct. 2012, vol. 1477, p. 14-19.

Partial European Search Report for Application No. EP 16194680, dated Feb. 15, 2017, 3 pages.

Search Report for Singapore Application No. 102015033865, dated Feb. 16, 2017, 7 pages.

U.S. Appl. No. 12/819,534, Final Office Action dated Jan. 20, 2016.
U.S. Appl. No. 13/678,389, Final Office Action dated Feb. 4, 2016.
U.S. Appl. No. 13/678,389, Non-Final Office Action dated Sep. 14, 2016.
U.S. Appl. No. 14/887,021, Non-Final Office Action dated May 24, 2016.
U.S. Appl. No. 13/894,245, Final Office Action dated Feb. 5, 2016.
U.S. Appl. No. 13/894,245, Non-Final Office Action dated Sep. 7, 2016, 2016.
U.S. Appl. No. 14/887,021, Non-Final Office Action dated Feb. 18, 2016.
U.S. Appl. No. 14/887,021, Final Office Action dated Nov. 18, 2016.
U.S. Appl. No. 14/935,145, Non-Final Office Action dated Mar. 17, 2016.
U.S. Appl. No. 14/979,889, Non-Final Office Action dated Jul. 1, 2016.

European Search Report for Application No. 10849171.3, dated Aug. 9, 2016, 11 pages.

Asbeck et al., "Heterojunction bipolar transistors implemented with GaInNAs materials," Semiconductor Science and Technology, vol. 17, No. 8, pp. 898-906, Jul. 2002.

Bank, et al., "Molecular-beam epitaxy growth of low-threshold cw GainNAsSb lasers at 1.5 µm," pp. 1337-1340, J. Vac. Sci. Technol. B 23(3), May/Jun. 2005.

Bertness et al., "29.5%-Efficient GaInP/GaAs Tandem Solar Cells," Applied Physics Letters, vol. 65, Aug. 22, 1994, pp. 989-991.

Bhuiyan et al., "InGaN Solar Cells: Present State of the Art and Important Challenges", IEEE Journal of Photovoltaics, vol. 2, No. 3, Jul. 2012, p. 246-293.

Cornfeld et al., "Evolution of a 2.05 eV AlGaInP Top Sub-cell for 5 and 6J-IMM Applications", Photovoltaic Specialists Conference (PVSC), 38th IEEE, Jun. 3, 2012, p. 2788-2791.

Cotal et al., "III-V multijunction solar cells for concentrating photovoltaics" pp. 174-192, www.rsc.org/ees, Energy and Environmental Science 2, (2009).

Denton et al., Vegard's Law, Physical Review, A, The American Physical Society, vol. 43 No. 6, pp. 3161-3164 (1991).

E. Wesoff, "CPV Roundup: SolFocus funding, 5MW order for Solar Junction, GreenVolts, Amonix", Greentech Media, May 22, 2012, 3 pages.

E. Wesoff, "Record 44 percent CPV efficiency from startup Solar Junction", Greentech Media, Oct. 15, 2012, 3 pages.

E. Wesoff, "Update: Solar Junction breaking CPV efficiency records, raising $30M", Greentech Media, Apr. 15, 2011, 4 pages.

Ferguson et al., Nonradiative Recombination in 1.56 µm GaIn-NAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Friedman et al., "Analysis of Depletion-Region Collection in GaIn-NAs Solar Cells," pp. 691-694, Conference Record of the Thirty-first IEEE Photovoltaic Specialists Conference, Lake Buena Vista, Florida, Jan. 3-7, 2005.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., "1-eV Solar cells with GaInNAs active layer", Journal of Crystal Growth, vol. 195, 1998, p. 409-415.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Garcia et al., Analysis of Tellurium as N-Type Dopant in GaInP: Doping, Diffusion, Memory Effect and Surfactant Properties, pp. 794-799, Journal of Crystal Growth 298 (2007).

Geelen et al., Epitaxial Lift-Off GaAs Solar Cell From a Reusable GaAs Substrate, pp. 162-171, Materials Science and Engineering B45 (1997).

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Green et al., Progress in Photovoltaics: Research and Applications 19 (2011) pp. 565-572.

Green et al., Progress in Photovoltaics: Research and Applications 20 (2012) pp. 12-20.

Green, "Third Generation Photovoltaics: Advanced Solar Energy Conversion," pp. 95-109, Springer Publishing, Berlin, Germany (2003).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

Gu et al., "Gas Source Growth and Doping Characteristics of AlInP on GaAs" Materials Science and Engineering B 131 (2006), pp. 49-53.

Harris Jr. et al., "Development of GainNAsSballoys: Growth, band structure, optical properties and applications," 2007, Physics Status Solidi(b), vol. 244, Issue 8, pp. 2707-2729, Jul. 6, 2007.

Hovel H.J., "Semiconductors and Semimetals", Academic Press, New York, 1975, Ch. 2, pp. 8-47.

Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783 -786, May 2006.

Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.

Jackrel et al., "Dilute nitride GainNAs and GainNAsSb solar cells by molecular beam epitaxy", pp. 1-8, Journal of Applied Physics 101 (114916), Jun. 14, 2007.

Janotti et. al., Mutual Passivation of Electrically Active and Isovalent Impurities in Dilute Nitrides, Physical Review Letters 100, 045505 (2008).

King et al., "40% Efficient Metamorphic GaInP/GaInAs/Ge Multijunction Solar Cells," J. of Applied Physics Letters, May 4, 2007.

King et al., "High-Voltage, Low-Current GaInP/GaInP/GaAs/GaIn-NAs/Ge Solar Cells" Spectrolab Inc., 2002, pp. 852-855.

Kudrawiec et al., "Band Gap Discontinuity in Ga0.9In0.1N0.027As0.973—xSbx/GaAs Single Quantum Wells with 0<x<0.06

(56) References Cited

OTHER PUBLICATIONS

Studied by Contactless Electroreflectance Spectroscopy", Applied Physics Letters, 2006, vol. 88, p. 221113.

Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.

Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.

Kurtz et al., "Projected Performance of Three and Four-Junction Devices Using GaAs and GaInP," pp. 875-878, 26th IEEE Photovoltaics Specialists Conference, 1997.

Law et al., "Future technology pathways of terrestrial III-V multijunction solar cells for concentrator photovoltaic systems," Solar Energy Materials & Solar Cells 94 (2010) pp. 1314-1318.

Merrill et al, Directions and Materials Challenges in High Performance Photovoltaics, Dec. 2007, JOM Energetic Thin Films, 59, 12, 26-30.

Miller et al., "GaAs—AlGaAs tunnel junctions for multigap cascade solar cells", Journal of Applied Physics, vol. 53, No. 1, Jan. 1982, p. 744-748.

Miyashita et al., "Improvement of GaInNAsSb films fabricated by atomic hydrogen-assisted molecular beam epitaxy", pp. 3249-3251, Journal of Crystal Growth 311, 2009.

Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.

Ng et al., 1EV GANXAS1-X-YSBY Material for Lattice-Matched III-V Solar Cell Implementation on GaAs and Ge, pp. 76-80, (2009).

Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.

Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.

Ptak et al., "Defects in GaInNAs: What We've Learned so Far" National Renewable Energy Laboratory NREL/CP-520-33555, May 2003, 7 pages.

Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).

Ptak et al., "Low-acceptor-Concentration GaInNAs grown by Molecular-beam Epitaxy for High-current p-i-n solar cell applications." J. of Applied Physics, 98.094501 (2005).

Sabnis et al., A new roadmap for space solar cells, Industry Photovoltaics, www.compoundsemiconductor.net/csc/features-details/19735471, Aug./Sep. 2012, 5 pages.

Solar Junction Inc., "Sharp Develops Solar Cell with Word's Highest Conversion Efficiency of 35.8%" Press Release, dated Oct. 22, 2009, 3 pages.

Volz et al., MOVPE growth of dilute nitride III/V semiconductors using all liquid metalorganic precursors, Journal of Crystal Growth 311 (2009), pp. 2418-2526.

Volz et al., Optimization of Annealing Conditions of (GaIn)(NAs) for Solar Cell Applications, pp. 2222-2228, Journal of Crystal Growth 310 (2008).

Weyers et al., "Red shift of photoluminescence and absorption in dilute GaAsN alloy layers", Japan Journal of Applied Physics, vol. 31, Issue 7A, 1992, p. L853-L855.

Wiemer et al., "43.5% Efficient Lattice Matched Solar Cells" Proc. SPIE 810804, High and Low Concentrator Systems for Solar Electric Applications VI (Sep. 19, 2011).

Wistey et al., Nitrogen Plasma Optimization for High-Quality Dilute Nitrides, pp. 229-233, Journal of Crystal Growth, available online on Feb. 1, 2005 at http://www.sciencedirect.com.

Wu et al., Band Anticrossing in Highly Mismatched III-V Semiconductor Alloys, pp. 860-869, Semiconductor Science and Technology 17 (2002).

Yamaguchi et al., "Multi-junction III-V solar cells: current status and future potential", in: Solar Energy, vol. 79, issue 1, Jul. 2005.

Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).

Yuen, "The role of antimony on properties of widely varying GaInNAsSb compositions", Journal of Applied Physics, May 2006, vol. 99, p. 093504-1 to 093804-8.

International Preliminary Report on Patentability for PCT Application No. PCT/US2010/056800, dated May 31, 2012, 6 pages.

International Preliminary Report on Patentability for PCT Application No. PCT/US2011/036486, dated Apr. 30, 2013.

International Preliminary Report on Patentability PCT/US2008/008495 dated Jan. 12, 2010, 5 pages.

International Search Report and Written Opinion corresponding to the PCT application No. PCT/US10/39534, dated Sep. 8, 2010, 8 pages.

International Search Report and Written Opinion corresponding to the PCT application No. PCT/US10/56800, dated Jan. 26, 2011, 8 pages.

International Search Report and Written Opinion corresponding to the PCT application No. PCT/US11/36486, dated Aug. 25, 2011,12 pages.

International Search Report and Written Opinion corresponding to the PCT application No. PCT/US2010/061635, dated Mar. 1, 2011, 7 pages.

International Search Report and Written Opinion for PCT Application No. PCT/US2013/033567, dated Mar. 4, 2014, 12 pages.

International Search Report and Written Opinion of the International Searching Authority for PCT Application No. PCT/US 12/25307, dated Aug. 16, 2012, 13 pages.

International Search Report and Written Opinion of the International Searching Authority for PCT Application No. PCT/US 12/36020, dated Aug. 14, 2012, 11 pages.

International Search Report and Written Opinion PCT/US2008/008495 dated Apr. 6, 2009, 5 pages.

Extended European Search Report for EP Application No. 10849171.3, dated Aug. 9, 2016, 10 pages.

Amendment, Affidavits under 37 C.F.R. §132, and Information Disclosure Statement filed Nov. 2013 for U.S. Appl. No. 13/739,989, 51 pages.

Final Office Action for U.S. Appl. No. 12/217,818, dated Jan. 1, 2011, 15 pages.

Final Office Action for U.S. Appl. No. 12/819,534, dated Sep. 9, 2013, 13 pages.

Final Office Action for U.S. Appl. No. 12/914,710, dated Sep. 6, 2013, 17 pages.

Final Office Action for U.S. Appl. No. 12/944,439, dated May 29, 2013, 11 pages.

Final Office Action for U.S. Appl. No. 12/944,439, dated May 29, 2013, 17 pages.

Final Office Action for U.S. Appl. No. 13/104,913, dated Oct. 2, 2013, 12 pages.

Final Office Action for U.S. Appl. No. 13/618,496, dated Feb. 6, 2013, 8 pages.

Final Office Action for U.S. Appl. No. 13/678,389, dated Oct. 10, 2014, 15 pages.

Final Office Action for U.S. Appl. No. 13/708,791, dated Oct. 1, 2013, 15 pages.

Final Office Action for U.S. Appl. No. 13/739,989, dated Feb. 26, 2014, 16 pages.

Final Office Action for U.S. Appl. No. 13/819,534, dated Sep. 9, 2013, 13 pages.

Non-Final Office Action for U.S. Appl. No. 12/944,439, dated Aug. 13, 2014, 11 pages.

Non-Final Office Action for U.S. Appl. No. 13/370,500, dated Dec. 31, 2013, 7 pages.

Non-Final Office Action for U.S. Appl. No. 12/217,818, dated Jun. 10, 2010, 15 pages.

(56) References Cited

OTHER PUBLICATIONS

Non-Final Office Action for U.S. Appl. No. 12/708,763, dated Apr. 15, 2013, 23 pages.
Non-Final Office Action for U.S. Appl. No. 12/749,076, dated Oct. 24, 2012, 17 pages.
Non-Final Office Action for U.S. Appl. No. 12/819,534, dated Feb. 13, 2013, 8 pages.
Non-Final Office Action for U.S. Appl. No. 12/819,534, dated Sep. 16, 2015, 10 pages.
Non-Final Office Action for U.S. Appl. No. 12/914,710, dated Feb. 15, 2013, 14 pages.
Non-Final Office Action for U.S. Appl. No. 12/944,439, dated Oct. 5, 2012, 15 pages.
Non-Final Office Action for U.S. Appl. No. 13/104,913, dated Nov. 8, 2012, 12 pages.
Non-Final Office Action for U.S. Appl. No. 13/442,146, dated Mar. 21, 2014, 6 pages.
Non-Final Office Action for U.S. Appl. No. 13/618,496, dated Dec. 14, 2012, 16 pages.
Non-Final Office Action for U.S. Appl. No. 13/678,389, dated Feb. 20, 2014, 13 pages.
Non-Final Office Action for U.S. Appl. No. 13/678,389, dated Jul. 6, 2015, 11 pages.
Non-Final Office Action for U.S. Appl. No. 13/708,791, dated Apr. 25, 2013, 16 pages.
Non-Final Office Action for U.S. Appl. No. 13/739,989, dated May 24, 2013, 7 pages.
Non-Final Office Action for U.S. Appl. No. 13/894,245, dated Jun. 24, 2015, 19 pages.
Non-Final Office Action for U.S. Appl. No. 14/678,737, dated Jul. 6, 2015, 13 pages.
Notice of Allowance for U.S. Appl. No. 12/914,710, dated Sep. 25, 2015, 13 pages.
Notice of Allowance for U.S. Appl. No. 13/104,913, dated Feb. 21, 2014, 8 pages.
Notice of Allowance for U.S. Appl. No. 13/370,500, dated Sep. 22, 2014, 10 pages.
Notice of Allowance for U.S. Appl. No. 13/442,146, dated Jul. 7, 2015, 7 pages.
Notice of Allowance for U.S. Appl. No. 13/618,496, dated Mar. 22, 2013, 8 pages.
Notice of Allowance for U.S. Appl. No. 13/708,763, dated Feb. 20, 2014, 9 pages.
Notice of Allowance for U.S. Appl. No. 13/708,791, dated Oct. 31, 2014, 8 pages.
Notice of Allowance for U.S. Appl. No. 13/739,989, dated Sep. 30, 2014, 9 pages.
Notice of Allowance for U.S. Appl. No. 14/512,224, dated Jan. 30, 2015, 8 pages.
Notice of Allowance for U.S. Appl. No. 14/678,737, dated Oct. 27, 2015, 18 pages.
Final Office Action for U.S. Appl. No. 14/935,145, dated Oct. 25, 2016, 28 pages.
Guter et al., "Current-matched triple-junction solar cell reaching 41.1% conversion efficiency under concentrated sunlight," Applied Physics Letters, Jun. 2009, vol. 94, No. 22, p. 223504.
Takamoto et al., "InGaP/GaAs-based multijunction solar cells," Progress in Photovoltaics: Research and Applications, Sep. 2005, vol. 13, No. 6, p. 495-511.
European Search Report for Application No. 10849171.3, dated Jun. 1, 2017, 8 pages.
European Search Report for Application No. 16194680.1, dated May 29, 2017, 16 pages.
International Search Report and Written Opinion for PCT Application No. PCT/US2016/056437, dated Mar. 20, 2017, 19 pages.
Final Office Action for U.S. Appl. No. 13/894,254, dated May 19, 2017, 17 pages.
Non-Final Office Action for U.S. Appl. No. 14/887,021, dated Jul. 20, 2017, 10 pages.
Ptak et al., "Effects of Bismuth on Wide-Depletion-Width GaInNAs Solar Cells," Journal of Vacuum Science and Technology, 2008, vol. 26, No. 3, p. 1053-1057.
Non-Final Office Actin for U.S. Appl. No. 14/935,145, dated Sep. 22, 2017, 34 pages.
Polojarvi et al., "Comparative study of defect levels in GaInNAs, NaNAsSb, and GaInNAsSb for High-Efficiency Solar Cells," Applied Physics Letters, 2016, vol. 108, No. 12, p. 122104.
International Search Report and Written Opinion for Application No. PCT/US2017/032712, dated Aug. 2, 2017, 14 pages.
Search Report for Taiwan Application No. 105133762, dated Jul. 12, 2017, 1 page.

* cited by examiner

LATTICE MATCHABLE ALLOY FOR SOLAR CELLS

This application is a continuation of U.S. application Ser. No. 14/979,899, filed on Dec. 28, 2015, currently, which is a continuation of U.S. application Ser. No. 14/678,737, filed on Apr. 3, 2015, issued as U.S. Pat. No. 9,252,315, which is a continuation of U.S. application Ser. No. 14/597,621, filed on Jan. 15, 2015, which is a continuation of U.S. application Ser. No. 14/512,224, filed on Oct. 10, 2014, issued as U.S. Pat. No. 9,018,522, which is a continuation of Ser. No. 13/739,989, filed on Jan. 11, 2013, issued as U.S. Pat. No. 8,912,433, which is a divisional of U.S. application Ser. No. 12/749,076, filed on Mar. 29, 2010, each of which is incorporated by reference herein in its entirety.

BACKGROUND OF THE INVENTION

The present invention relates to multijunction solar cells, and in particular to high efficiency solar cells comprised of III-V semiconductor alloys.

Multijunction solar cells made primarily of III-V semiconductor alloys are known to produce solar cell efficiencies exceeding efficiencies of other types of photovoltaic materials. Such alloys are combinations of elements drawn from columns III and V of the standard Periodic Table, identified hereinafter by their standard chemical symbols, names and abbreviation. (Those of skill in the art can identify their class of semiconductor properties by class without specific reference to their column.) The high efficiencies of these solar cells make them attractive for terrestrial concentrating photovoltaic systems and systems designed to operate in outer space. Multijunction solar cells with efficiencies above 40% under concentrations equivalent to several hundred suns have been reported. The known highest efficiency devices have three subcells with each subcell consisting of a functional p-n junction and other layers, such as front and back surface field layers. These subcells are connected through tunnel junctions, and the dominant layers are either lattice matched to the underlying substrate or are grown over metamorphic layers. Lattice-matched devices and designs are desirable because they have proven reliability and because they use less semiconductor material than metamorphic solar cells, which require relatively thick buffer layers to accommodate differences in the lattice constants of the various materials. As set forth more fully in U.S. patent application Ser. No. 12/217,818, entitled "GaInNAsSb Solar Cells Grown by Molecular Beam Epitaxy," which application is incorporated herein by reference, a layer made of GaInNAsSb material to create a third junction having a band gap of approximately 1.0 eV offers a promising approach to improving the efficiency of multijunction cells. Improvements are nevertheless to be considered on the cell described in that application.

The known highest efficiency, lattice-matched solar cells typically include a monolithic stack of three functional p-n junctions, or subcells, grown epitaxially on a germanium (Ge) substrate. The top subcell has been made of (Al)GaInP, the middle one of (In)GaAs, and the bottom junction included the Ge substrate. (The foregoing nomenclature for a III-V alloy, wherein a constituent element is shown parenthetically, denotes a condition of variability in which that particular element can be zero.) This structure is not optimal for efficiency, in that the bottom junction can generate roughly twice the short circuit current of the upper two junctions, as reported by J. F. Geisz et al., "Inverted GaInP/(In)GaAs/InGaAs triple junction solar cells with low-stress metamorphic bottom junctions," *Proceedings of the 33rd IEEE PVSC Photovoltaics Specialists Conference,* 2008. This extra current capability is wasted, since the net current must be uniform through the entire stack, a design feature known as current matching.

In the disclosure of above noted U.S. patent application Ser. No. 12/217,818, it was shown that a material that is substantially lattice matched to Ge or GaAs with a band gap near 1.0 eV might be used to create a triple junction solar cell with efficiencies higher than the structure described above by replacing the bottom Ge junction with a junction made of a different material that produces a higher voltage.

In addition, it has been suggested that the use of this 1 eV material might be considered as a fourth junction to take advantage of the entire portion of the spectrum lying between 0.7 eV (the band gap for germanium) and 1.1 eV (the upper end of the range of bandgaps for the ~1 eV layer). See for example, S. R. Kurtz, D. Myers, and J. M. Olson, "Projected Performance of Three and Four-Junction Devices Using GaAs and GaInP," *26th IEEE Photovoltaics Specialists Conference,* 1997, pp. 875-878. $Ga_{1-x}In_xN_yAs_{1-y}$ has been identified as such a 1 eV material, but currents high enough to match the other subcells have not been achieved, see, e.g., A. J. Ptak et al., *Journal of Applied Physics* 98 (2005) 094501. This has been attributed to low minority carrier diffusion lengths that prevent effective photocarrier collection. Solar subcell design composed of gallium, indium, nitrogen, arsenic and various concentrations of antimony (GaInNAsSb) has been investigated with the reported outcome that antimony is helpful in decreasing surface roughness and allowing growth at higher substrate temperatures where annealing is not necessary, but the investigators reported that antimony, even in small concentrations is critical to be avoided as detrimental to adequate device performance. See Ptak et al., "Effects of temperature, nitrogen ion, and antimony on wide depletion width GaInNAs," *Journal of Vacuum Science Technology* B 25(3) May/June 2007 pp. 955-959. Devices reported in that paper have short circuit currents far too low for integration into multijunction solar cells. Nevertheless, it is known that $Ga_{1-x}In_xN_yAs_{1-y-z}Sb_z$ with $0.05 \leq x \leq 0.07$, $0.01 \leq y \leq 0.02$ and $0.02 \leq z \leq 0.06$ can be used to produce a lattice-matched material with a band gap of approximately 1 eV that can provide sufficient current for integration into a multijunction solar cell. However, the voltages generated by subcells containing this material have not exceeded 0.30 V under 1 sun of illumination. See D. B. Jackrel et al., *Journal of Applied Physics* 101 (114916) 2007. Thus, a triple-junction solar cell with this material as the bottom subcell has been expected to be only a small improvement upon an analogous triple junction solar cell with a bottom subcell of Ge, which produces an open circuit voltage of approximately 0.25 V. See H. Cotal et al., *Energy and Environmental Science* 2 (174) 2009. What is needed is a material that is lattice-matched to Ge and GaAs with a band gap near 1 eV that produces an open circuit voltage greater than 0.30 V and sufficient current to match (Al)InGaP and (In)GaAs subcells. Such a material would also be advantageous as a subcell in high efficiency solar cells with 4 or more junctions.

SUMMARY OF THE INVENTION

According to the invention, an alloy composition is provided that has a bandgap of at least 0.9 eV, namely, $Ga_{1-x}In_xN_yAs_{1-y-z}Sb_z$ with a low antimony (Sb) content and with enhanced indium (In) content and enhanced nitrogen (N) content as compared with known alloys of GaInNAsSb, achieving substantial lattice matching to GaAs and Ge substrates and providing both high short circuit currents and high open circuit voltages in GaInNAsSb subcells suitable for use in multijunction solar cells. The composition ranges for $Ga_{1-x}In_xN_yAs_{1-y-z}Sb_z$ are $0.07 \leq x \leq 0.18$, $0.025 \leq y \leq 0.04$ and $0.001 \leq z \leq 0.03$. These composition ranges employ greater fractions of In and N in GaInNAsSb than previously taught and allow the creation of subcells with bandgaps that are design-tunable in the range of 0.9-1.1 eV, which is the range of interest for GaInNAsSb subcells. This composition range alloy will hereinafter be denoted "low-antimony, enhanced indium-and-nitrogen GaInNAsSb" alloy. Subcells of such an alloy can be grown by molecular beam epitaxy (MBE) and should be able to be grown by metalorganic chemical vapor deposition (MOCVD), using techniques known to one skilled in the art.

The invention described herein reflects a further refinement of work described in U.S. patent application Ser. No. 12/217,818, including the discovery and identification of specific ranges of elements, i.e., a specific alloy mix of the various elements in GaInNAsSb that improve significantly the performance of the disclosed solar cells.

The invention will be better understood by reference to the following detailed description in connection with the accompanying drawings.

DETAILED DESCRIPTION OF THE INVENTION

Figure 1A:
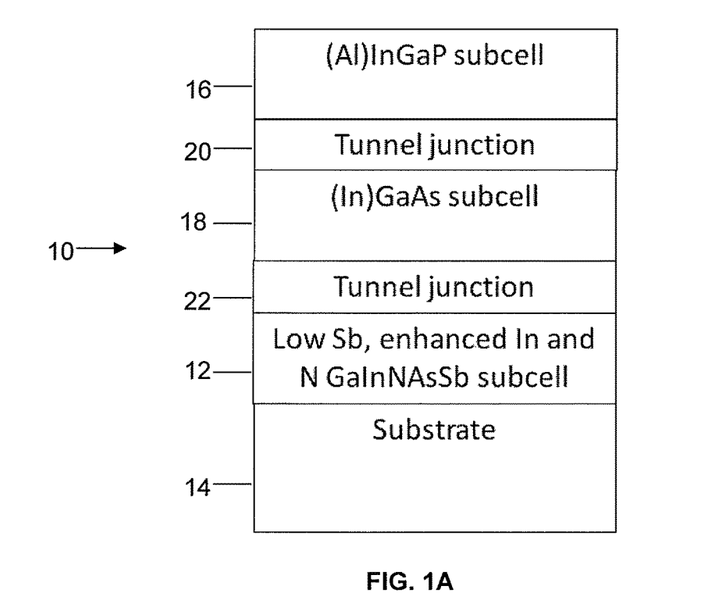
FIG. 1A is a schematic cross-section of a three junction solar cell incorporating the invention.

FIG. 1A is a schematic cross-section showing an example of a triple junction solar cell 10 according to the invention consisting essentially of a low Sb, enhanced In and N GaInNAsSb subcell 12 adjacent the Ge, GaAs or otherwise compatible substrate 14 with a top subcell 16 of (Al)InGaP and a middle subcell 18 using (In)GaAs. Tunnel junction 20 is between subcells 16 and 18, while tunnel junction 22 is between subcells 18 and 12. Each of the subcells 12, 16, 18 comprises several associated layers, including front and back surface fields, an emitter and a base. The named subcell material (e.g., (In)GaAs) forms the base layer, and may or may not form the other layers.

Figure 1B:
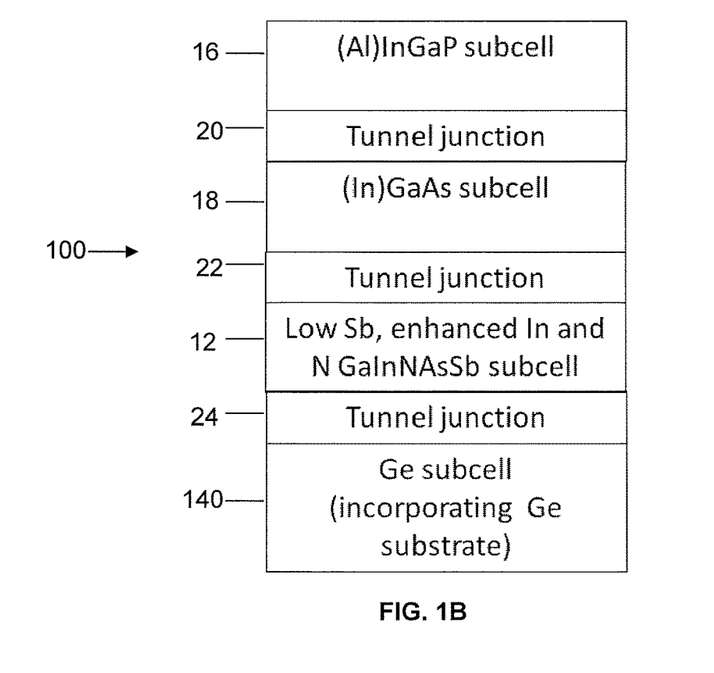
FIG. 1B is a schematic cross-section of a four junction solar cell incorporating the invention.

Low Sb, enhanced In and N GaInNAsSb subcells may also be incorporated into multijunction solar cells with four or more junctions without departing from the spirit and scope of the invention. FIG. 1B shows one such four-junction solar cell 100 with a specific low Sb, enhanced In and N GaInNAsSb subcell 12 as the third junction, and with a top subcell 16 of (Al)InGaP, a second subcell 18 of (In)GaAs and a bottom subcell 140 of Ge, which is also incorporated into a germanium (Ge) substrate. Each of the subcells 16, 18, 12, 140 is separated by respective tunnel junctions 20, 22, 24, and each of the subcells 16, 18, 12, 140 may comprise several associated layers, including optional front and back surface fields, an emitter and a base. The named subcell material (e.g., (In)GaAs) forms the base layer, and may or may not form the other layers.

Figure 2A:
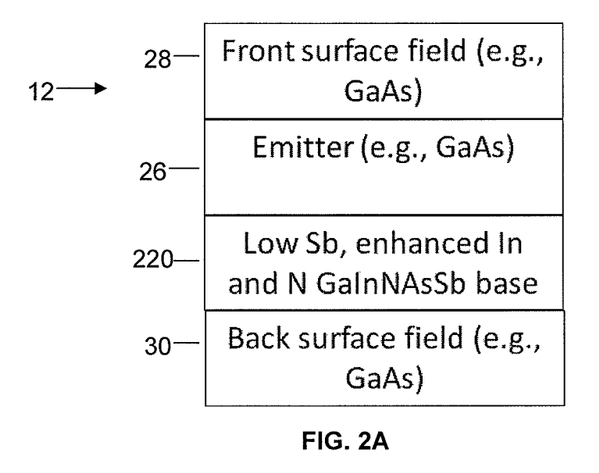
FIG. 2A is a schematic cross-section of a GaInNAsSb subcell according to the invention.

By way of further illustration, FIG. 2A is a schematic cross-section in greater detail of a GaInNAsSb subcell 12, according to the invention. The low Sb, enhanced In and N GaInNAsSb subcell 12 is therefore characterized by its use of low Sb, enhanced In and N GaInNAsSb as the base layer 220 in the subcell 12. Other components of the GaInNAsSb subcell 12, including an emitter 26, an optional front surface field 28 and back surface field 30, are preferably III-V alloys, including by way of example GaInNAs(Sb), (In)(Al)GaAs, (Al)InGaP or Ge. The low Sb, enhanced In and N GaInNAsSb base 220 may either be p-type or n-type, with an emitter 26 of the opposite type.

Figure 2B:
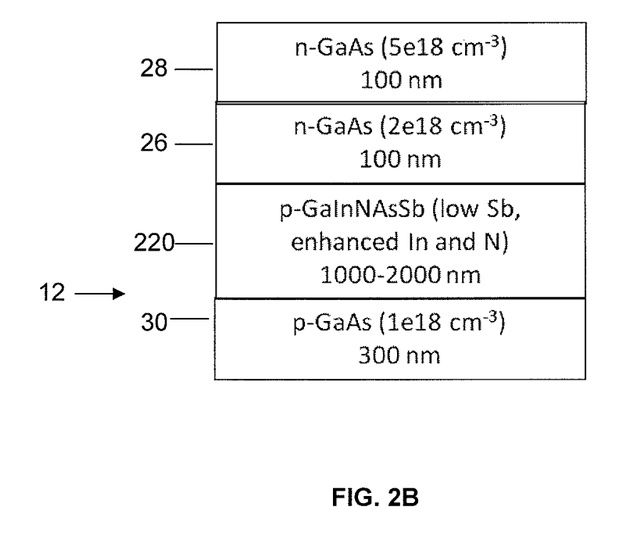
FIG. 2B is a detailed schematic cross-section illustrating an example GaInNAsSb subcell.

To determine the effect of Sb on enhanced In and N GaInNAsSb subcell performance, various subcells of the type (12) of the structure shown in FIG. 2B were investigated. FIG. 2B is a representative example of the more general structure 12 in FIG. 2A. Base layers 220 with no Sb, low Sb ($0.001 \leq z \leq 0.03$) and high Sb ($0.03 \leq z \leq 0.06$) were grown by molecular beam epitaxy and were substantially lattice-matched to a GaAs substrate (not shown). These alloy compositions were verified by secondary ion mass spectroscopy. The subcells 12 were subjected to a thermal anneal, processed with generally known solar cell processing, and then measured under the AM1.5D spectrum (1 sun) below a filter that blocked all light above the GaAs band gap. This filter was appropriate because a GaInNAsSb subcell 12 is typically beneath an (In)GaAs subcell in a multijunction stack (e.g., FIGS. 1A and 1B), and thus light of higher energies will not reach the subcell 12.

Figure 3:
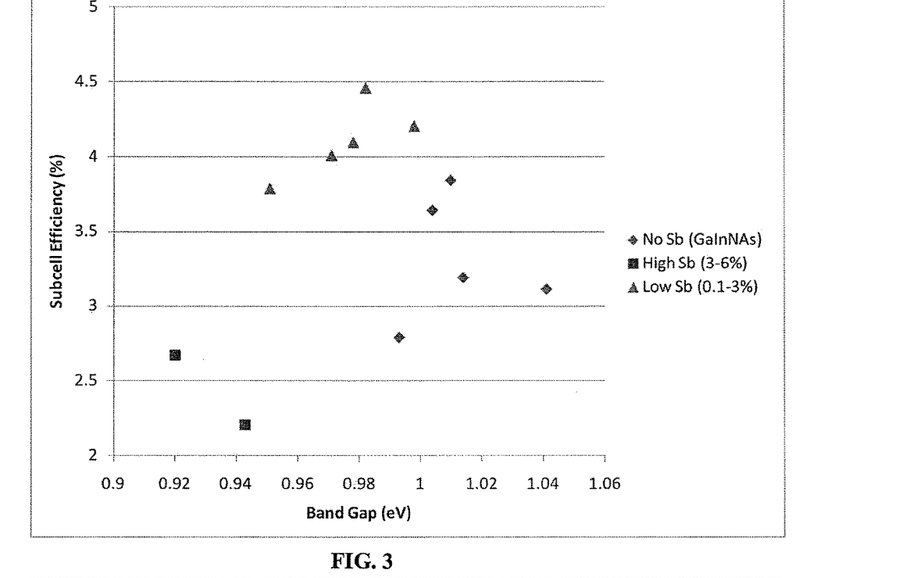
FIG. 3 is a graph showing the efficiency versus band gap energy of subcells formed from different alloy materials, for comparison.
Figure 4:
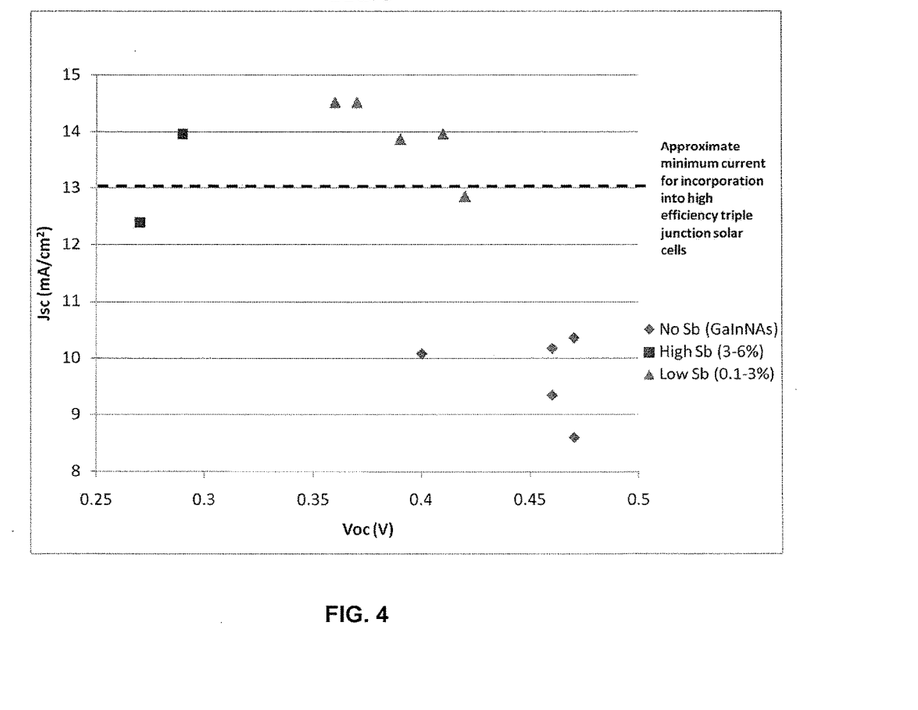
FIG. 4 is a plot showing the short circuit current ($J_{sc}$) and open circuit voltage ($V_{oc}$) of subcells formed from different alloy materials, for comparison.

FIG. 3 shows the efficiencies produced by the subcells 12 grown with different fractions of Sb as a function of their band gaps. The indium and nitrogen concentrations were each in the 0.07 to 0.18 and 0.025 to 0.04 ranges, respectively. It can be seen that the low Sb, enhanced In and N GaInNAsSb subcells (represented by triangles) have consistently higher subcell efficiencies than the other two candidates (represented by diamonds and squares). This is due to the combination of high voltage and high current capabilities in the low Sb, enhanced In and N GaInNAsSb devices. (See FIG. 4). As can be seen in FIG. 4, both the low and high concentration Sb devices have sufficient short-circuit current to match high efficiency (Al)InGaP subcells and (In)GaAs subcells (>13 mA/cm$^2$ under the filtered AM1.5D spectrum), and thus they may be used in typical three junction or four-junction solar cells 10, 100 without reducing the total current through the entire cell. This current-matching is essential for high efficiency. The devices without Sb have relatively high subcell efficiencies due to their high open circuit voltages, but their short circuit currents are too low for high efficiency multijunction solar cells, as is shown in FIG. 4.

FIG. 4 also confirms that Sb has a deleterious effect on voltage, as previously reported for other alloy compositions. However, in contrast to what has been previously reported for other alloy compositions, the addition of antimony does NOT decrease the short circuit current. The low Sb-type subcells have roughly 100 mV higher open-circuit voltages than the high Sb-type subcells. To illustrate the effect of this improvement, a triple-junction solar cell 10 with an open circuit voltage of 3.1 V is found to have 3.3% higher relative efficiency compared to an otherwise identical cell with an open circuit voltage of 3.0 V. Thus, the inclusion of Sb in GaInNAs(Sb) solar cells is necessary to produce sufficient current for a high efficiency solar cell, but only by using low Sb (0.1-3%) can both high voltages and high currents be achieved.

Compressive strain improves the open circuit voltage of low Sb, enhanced In and N GaInNAsSb subcells 10, 100. More specifically, low Sb, enhanced In and N GaInNAsSb layers 220 that have a lattice constant larger than that of a GaAs or Ge substrate when fully relaxed (≤0.5% larger), and are thus under compressive strain when grown pseudomorphically on those substrates. They also give better device performance than layers with a smaller, fully relaxed lattice constant (under tensile strain).

Figure 7:
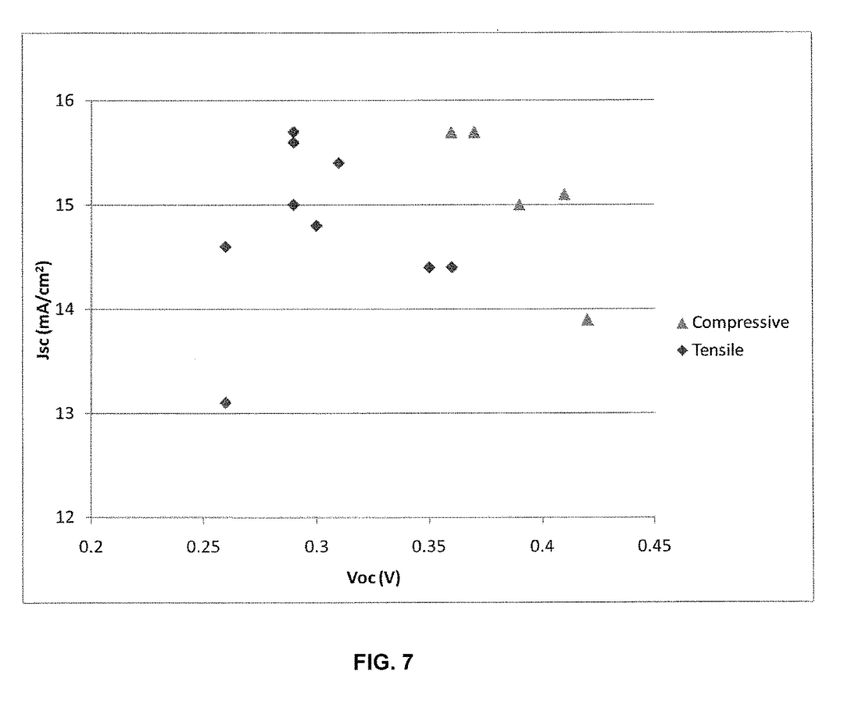
FIG. 7 is a graph of the short circuit current ($J_{sc}$) and open circuit voltage ($V_{oc}$) of low Sb, enhanced In and N GaInNAsSb subcells distinguished by the strain imparted to the film by the substrate.

FIG. 7 shows the short circuit current and open circuit voltage of low Sb, enhanced In and N GaInNAsSb subcells grown on GaAs substrates under compressive strain (triangles) and tensile strain (diamonds). It can be seen that the subcells under compressive strain have consistently higher open circuit voltages than those under tensile strain.

Figure 5:
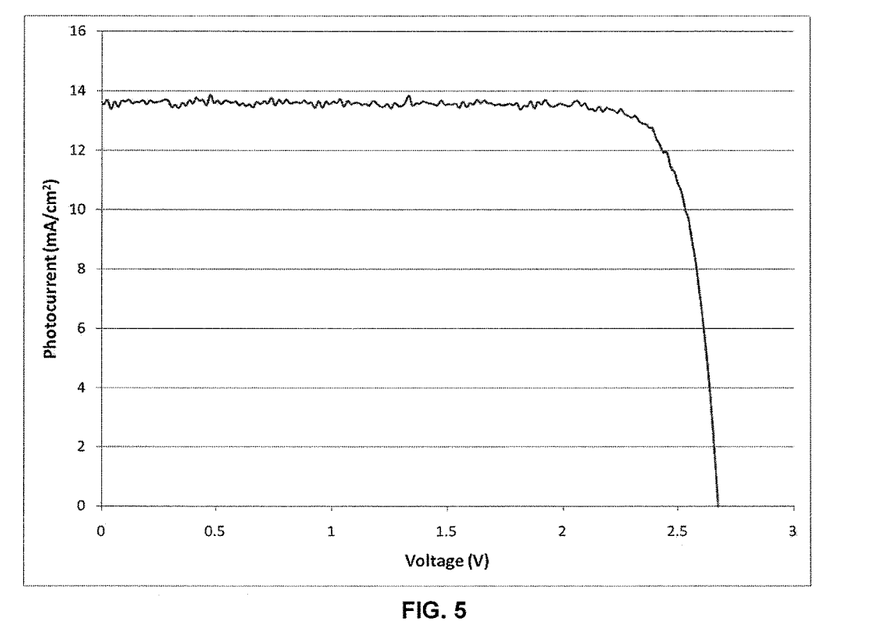
FIG. 5 is a graph showing the photocurrent as a function of voltage for a triple junction solar cell incorporating a subcell according to the invention, under 1-sun AM1.5D illumination.
Figure 6:
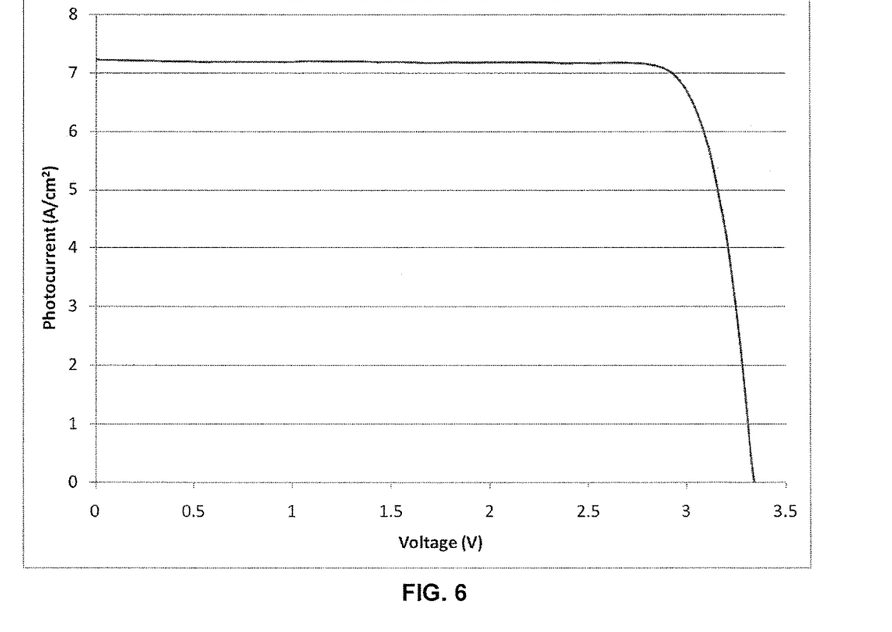
FIG. 6 is a graph showing the photocurrent as a function of voltage for a triple junction solar cell incorporating a subcell according to the invention, under AM1.5D illumination equivalent to 523 suns.

Low Sb, enhanced In and N, compressively-strained GaInNAsSb subcells have been successfully integrated into high efficiency multijunction solar cells. FIG. 5 shows a current-voltage curve of a triple junction solar cell of the structure in FIG. 1A under AM1.5D illumination equivalent to 1 sun. The efficiency of this device is 30.5%. FIG. 6 shows the current-voltage curve of the triple junction solar cell operated under a concentration equivalent to 523 suns, with an efficiency of 39.2%.

The invention has been explained with reference to specific embodiments. Other embodiments will be evident to those of ordinary skill in the art. It is therefore not intended for the invention to be limited, except as indicated by the appended claims.

What is claimed is:

1. A semiconductor alloy composition, wherein,
the semiconductor alloy composition comprises $Ga_{1-x}In_xN_yAs_{1-y-z}Sb_z$;
the content values for x, y, and z are within composition ranges as follows: $0.07 \leq x \leq 0.18$, $0.025 \leq y \leq 0.04$ and $0.001 \leq z \leq 0.03$;
the content levels are selected such that the semiconductor alloy composition exhibits a bandgap from 0.9 eV to 1.1 eV; a short circuit current density Jsc greater than 13 mA/cm$^2$ and an open circuit voltage Voc greater than 0.3 V, when illuminated with a filtered 1 sun AM1.5D spectrum in which all light having an energy greater than the bandgap of GaAs is blocked; and
the semiconductor alloy composition is substantially lattice matched to Ge or GaAs; and
the $Ga_{1-x}In_xN_yAs_{1-y-z}Sb_z$ semiconductor alloy composition is compressively strained.

2. The semiconductor alloy composition of claim 1, wherein,
the semiconductor alloy composition is characterized by a first lattice constant;
the Ge or GaAs is characterized by a second lattice constant; and
the first lattice constant is less than or equal to 0.5% larger than the second lattice constant when fully relaxed.

3. The semiconductor alloy composition of claim 1, wherein the semiconductor alloy composition is characterized by a thickness greater than 1 μm.

4. The semiconductor alloy composition of claim 1, wherein the semiconductor alloy composition is characterized by a thickness from 1 μm to 2 μm.

5. A multijunction solar cell comprising:
a semiconductor layer comprising Ge or GaAs;
a first subcell comprising the semiconductor alloy composition of claim 1 overlying the semiconductor layer; and
at least one second subcell overlying the first subcell.

6. The multijunction solar cell of claim 5, wherein,
the semiconductor alloy composition is characterized by a first lattice constant;
the Ge or GaAs is characterized by a second lattice constant; and
the first lattice constant is less than or equal to 0.5% larger than the second lattice constant when fully relaxed.

7. The multijunction solar cell of claim 5, wherein the semiconductor alloy composition is characterized by a thickness greater than 1 μm.

8. The multijunction solar cell of claim 5, wherein the semiconductor alloy composition is characterized by a thickness from 1 μm to 2 μm.

9. The multijunction solar cell of claim 5, wherein the at least one second subcell is selected from a $Ga_{1-x}In_xN_yAs_{1-y-z}Sb_z$ subcell, a GaInNAs(Sb) subcell, an (Al)(In)GaP subcell, an (In)(Al)GaAs subcell, an (Al)InGaP subcell, and an (In)GaAs subcell.

10. A method of manufacturing a multijunction solar cell, comprising:
forming a first subcell comprising the semiconductor alloy composition of claim 1 overlying a semiconductor layer comprising Ge or GaAs; and
forming at least one second subcell overlying the first subcell to form a multijunction solar cell.

11. The method of claim 10, wherein the at least one second subcell is selected from a $Ga_{1-x}In_xN_yAs_{1-y-z}Sb_z$ subcell, a GaInNAs(Sb) subcell, an (Al)(In)GaP subcell, an (In)(Al)GaAs subcell, an (Al)InGaP subcell, and an (In)GaAs subcell.

12. The semiconductor alloy composition of claim 1, wherein the semiconductor alloy composition comprises p doping.

13. The semiconductor alloy composition of claim 1, wherein the semiconductor alloy composition comprises n doping.

14. The multijunction solar cell of claim 5, wherein the semiconductor alloy composition comprises p doping.

15. The multijunction solar cell of claim 5, wherein the semiconductor alloy composition comprises n doping.

16. The multijunction solar cell of claim 5, wherein the solar cell comprises three junctions.

17. The multijunction solar cell of claim 5, wherein the solar cell comprises four junctions.

18. The multijunction solar cell of claim 5, wherein the solar cell comprises more than four junctions.

* * * * *